United States Patent
Park et al.

(10) Patent No.: US 8,143,634 B2
(45) Date of Patent: Mar. 27, 2012

(54) LIGHT EMITTING DIODE PACKAGE WITH A PHOSPHOR SUBSTRATE

(75) Inventors: Jung Kyu Park, Seoul (KR); Yu Dong Kim, Suwon (KR); Seung Hwan Choi, Suwon (KR); Seong Ah Joo, Suwon (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 114 days.

(21) Appl. No.: 12/000,958

(22) Filed: Dec. 19, 2007

(65) Prior Publication Data

US 2009/0072256 A1 Mar. 19, 2009

(30) Foreign Application Priority Data

Sep. 17, 2007 (KR) .................. 10-2007-0094376

(51) Int. Cl.
*H01L 33/00* (2010.01)
(52) U.S. Cl. .................. 257/98; 257/100; 257/E33.061
(58) Field of Classification Search .................. 257/98, 257/100, E33.061
See application file for complete search history.

(56) References Cited

U.S. PATENT DOCUMENTS

| | | | |
|---|---|---|---|
| 5,953,594 A * | 9/1999 | Bhatt et al. | 438/125 |
| 6,501,102 B2 * | 12/2002 | Mueller-Mach et al. | 257/84 |
| 6,638,780 B2 | 10/2003 | Fukasawa et al. | |
| 6,696,703 B2 * | 2/2004 | Mueller-Mach et al. | 257/98 |
| 6,727,643 B2 * | 4/2004 | Suehiro | 313/499 |
| 6,815,249 B2 | 11/2004 | Miura | |
| 7,334,907 B2 * | 2/2008 | Nagayama | 362/84 |
| 7,589,358 B2 * | 9/2009 | Dwilinski et al. | 257/102 |
| 7,642,704 B2 * | 1/2010 | Imai et al. | 313/483 |
| 2005/0219835 A1 | 10/2005 | Nagayama | |
| 2007/0057269 A1 * | 3/2007 | Ueda | 257/98 |

FOREIGN PATENT DOCUMENTS

| | | |
|---|---|---|
| JP | 6-7263 | 1/1994 |
| JP | 11-067799 A | 3/1999 |
| JP | 2002-124705 A | 4/2002 |
| JP | 2002-170993 | 6/2002 |
| JP | 2002-270901 | 9/2002 |
| JP | 2002-289925 | 10/2002 |
| JP | 2002-324917 A | 11/2002 |
| JP | 2004-165308 | 6/2004 |
| JP | 2005-277227 A | 10/2005 |
| JP | 2006-303458 A | 11/2006 |

OTHER PUBLICATIONS

Japanese Office Action, w/ English translation thereof, issued in Japanese Patent Application No. JP 2007-339710 dated Nov. 30, 2010.
Japanese Office Action, issued in Japanese Patent Application No. JP 2007-339710, dated May 10, 2011. Japanese Office Action, w/English translation thereof, issued in Japanese Patent Application No. 2011-193646, dated Dec. 13, 2011.
Japanese Decision to Decline Amendment and Decision of Rejection, together with English language versions thereof, issued in Japanese Patent Application No. 2007-339710, dated Dec. 20, 2011.

* cited by examiner

*Primary Examiner* — Howard Weiss
(74) *Attorney, Agent, or Firm* — McDermott Will & Emery LLP

(57) ABSTRACT

Provided is a light emitting diode (LED) package including a phosphor substrate; an LED chip mounted on the phosphor substrate; a circuit board mounted on the other region of the phosphor substrate excluding the region where the LED chip is mounted; an electrode connection portion for electrically connecting the LED chip and the circuit board; and a sealing member that covers the LED chip, the circuit board, and the phosphor substrate.

7 Claims, 2 Drawing Sheets

[FIG. 1] PRIOR ART
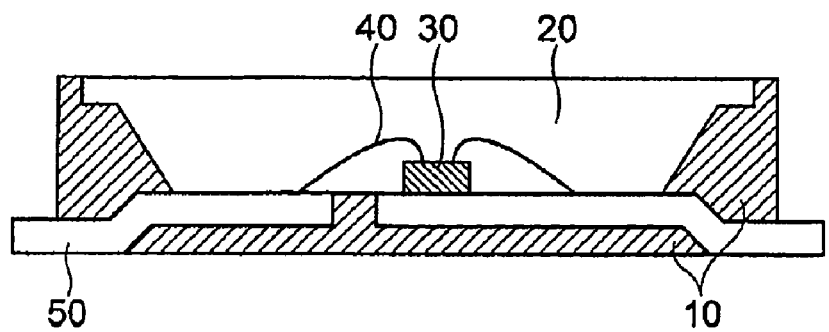
[FIG. 2]
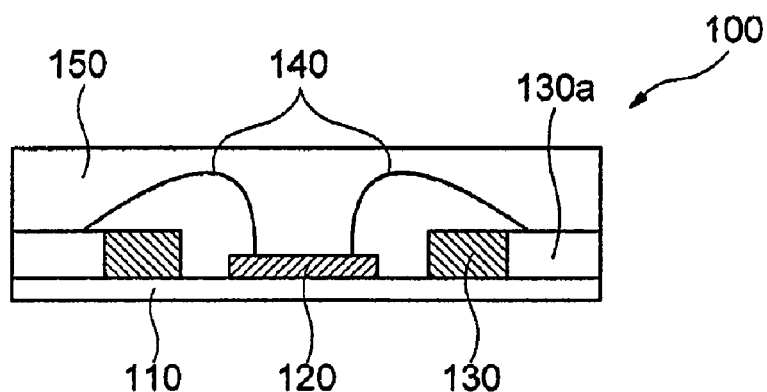
[FIG. 3A]
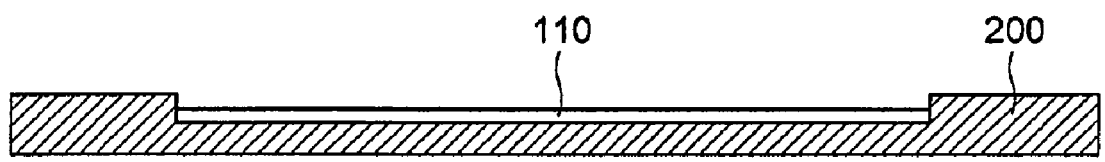
[FIG. 3B]
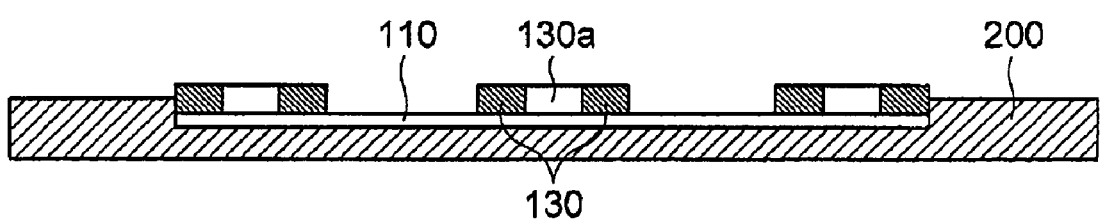

[FIG. 3C]
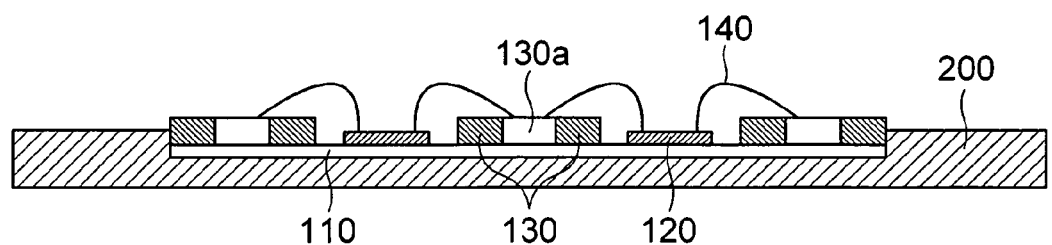
[FIG. 3D]
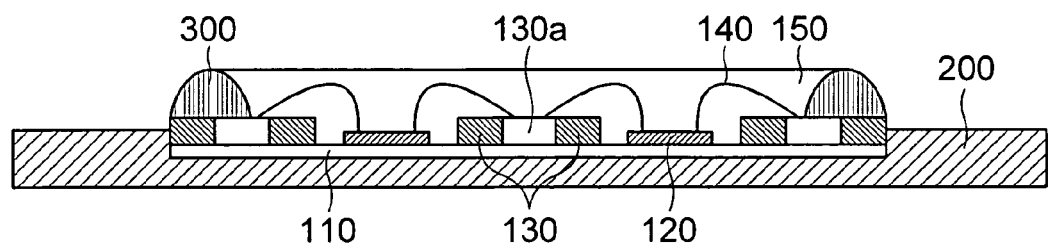
[FIG. 3E]
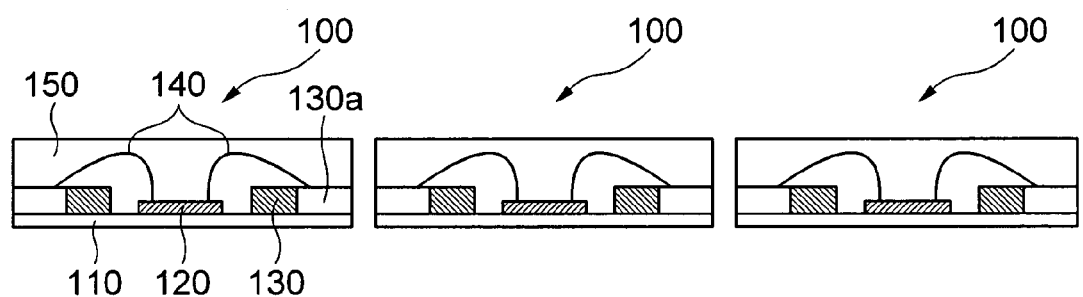

LIGHT EMITTING DIODE PACKAGE WITH A PHOSPHOR SUBSTRATE

CROSS-REFERENCE TO RELATED APPLICATIONS

This application claims the benefit of Korean Patent Application No. 10-2007-0094376 filed with the Korean Intellectual Property Office on Sep. 17, 2007, the disclosure of which is incorporated herein by reference.

BACKGROUND OF THE INVENTION

1. Field of the Invention

The present invention relates to a light emitting diode (LED) package and a method of manufacturing the same, and more specifically, an LED package, which can minimize a deviation of the color coordinate and can be reduced in size, and a method of manufacturing the same.

2. Description of the Related Art

In general, LEDs generate minority carriers (electrons and holes) injected by using a p-n junction structure of semiconductor and then recombine them to emit light. That is, when a forward voltage is applied to a semiconductor of a specific element, electrons and holes are recombined through migration in a positive-negative junction. Then, energy level is dropped, thereby emitting light.

Since the LEDs can irradiate high-efficiency light using a low voltage, the LEDs can be used in home appliances, remote controls, electric signs, displays, various automated equipments and the like.

In particular, as information communication devices are reduced in size and are slimmed, various parts of the devices such as resistors, condensers, noise filters and the like are further reduced in size. Recently, the LEDs are produced in the form of surface mount devices (SMDs) to be directly mounted on a printed circuit board (PCB).

LED packages manufactured in the form of SMD are divided into top-view type and side-view type LED packages, depending on the use thereof.

Hereinafter, a conventional LED package will be described in detail with reference to FIG. 1.

FIG. 1 is a cross-sectional view of a conventional LED package.

Referring to FIG. 1, the conventional LED package includes a lead frame 50 composed of a pair of lead terminals, a package 10 formed of synthetic resin so as to house portions of the lead frame 50 therein, an LED chip 30 mounted on the lead frame 50 positioned inside the package 10, an electrode connection portion 40 for electrically connecting the LED chip 30 and the lead frame 50, and a molding material 20 which is filled in the package 10 so as to protect the LED chip 30 and the electrode connection portion 40, the molding material including phosphor.

Meanwhile, general standards for determining the characteristics of an LED chip are a color, luminance, an intensity range of luminance and so on. Such characteristics of the LED chip are primarily determined by a material of a compound semiconductor used in the LED chip, and are secondarily affected by the structure of a package for mounting the LED chip and a molding material including phosphor filled in the package. In particular, the phosphor of the molding material filled in such an LED package has a great effect upon luminance of the LED chip and luminance distribution.

In the conventional LED package, a voluminous space for filling the molding material is constant. Therefore, an amount of coated phosphor can be constantly maintained so as to minimize a deviation of the color coordinate. As a result, it is possible to implement high luminance.

Recently, as a demand for high luminance of a screen and reduction in thickness of an LCD panel increases, the reduction in size and thickness of an LED package is considered to be an urgent problem.

In the above-described LED package, however, there is a limit in minimizing the height of the package for securing the space required for filling the molding material including phosphor. Therefore, there are difficulties in reducing the size and thickness of the LED package.

That is, although the deviation of the color coordinate can be minimized, there are difficulties in reducing the size and thickness of the LED package.

SUMMARY OF THE INVENTION

An advantage of the present invention is that it provides an LED package in which an LED chip is directly mounted on a phosphor substrate so as to minimize the thickness of the package for securing a molding material filling space. Therefore, a deviation of the color coordinate can be minimized, and simultaneously, the size and thickness thereof can be reduced.

Another advantage of the invention is that it provides a method of manufacturing the LED package.

Additional aspects and advantages of the present general inventive concept will be set forth in part in the description which follows and, in part, will be obvious from the description, or may be learned by practice of the general inventive concept.

According to an aspect of the invention, a light emitting diode (LED) package comprises a phosphor substrate; an LED chip mounted on the phosphor substrate; a circuit board mounted on the other region of the phosphor substrate excluding the region where the LED chip is mounted; an electrode connection portion for electrically connecting the LED chip and the circuit board; and a sealing member that covers the LED chip, the circuit board, and the phosphor substrate.

Preferably, the phosphor substrate is a glass substrate having phosphor contained therein or a glass substrate coated with phosphor.

Preferably, the electrode connection portion is formed of wire.

Preferably, the sealing member is formed of at least one of transparent epoxy and silicon and contains a reflective material.

Preferably, the circuit board is a ceramic substrate having one or more pairs of electrodes formed therein.

According to another aspect of the invention, a method of manufacturing an LED package comprises the steps of: preparing a phosphor substrate; mounting a circuit board on the phosphor substrate; mounting an LED chip on the other region of the phosphor substrate excluding the region where the circuit board is mounted; electrically connecting the LED chip and the circuit board through an electrode connection portion; and forming a sealing member such that the LED chip, the circuit board, and the phosphor substrate are covered by the sealing member.

Preferably, the phosphor substrate is a glass substrate having phosphor contained therein or a glass substrate coated with phosphor.

Preferably, the electrode connection portion is formed of wire.

Preferably, the sealing member is formed of at least one of transparent epoxy and silicon and contains a reflective material.

Preferably, the circuit board is a ceramic substrate having one or more pairs of electrodes formed therein.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a conventional LED package;

FIG. 2 is a cross-sectional view of an LED package according to an embodiment of the invention; and FIGS. 3A to 3E are cross-sectional views sequentially showing a method of manufacturing an LED package according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Structure of LED Package

Referring to FIG. 2, the structure of an LED package according to an embodiment of the invention will be described in detail.

FIG. 2 is a cross-sectional view of an LED package according to an embodiment of the invention.

As shown in FIG. 2, the LED package 100 according to an embodiment of the invention includes a phosphor substrate 110, an LED chip 120 mounted on one surface of the phosphor substrate 110, and a circuit board 130 mounted on the other region of the phosphor substrate 110 excluding the region where the LED chip 120 is mounted.

Preferably, the phosphor substrate 110 is formed of a glass substrate having phosphor contained therein or a glass substrate coated with phosphor.

The circuit board 130 has one or more pairs of electrodes 130a formed therein. In this embodiment, the circuit board 130 is formed of a ceramic substrate, which can be changed depending on element characteristics and process conditions.

Further, the LED chip 120 and each of the electrodes 130a of the circuit board 130 are electrically connected through an electrode connection portion 140.

In this embodiment, the electrode connection portion 140 for electrically connecting the LED chip 120 and the electrode 130a is formed of wire.

On the phosphor substrate 110 having the LED chip 120 mounted thereon, a sealing member 150 is formed so as to cover the LED chip 120, the phosphor substrate 110, and the circuit board 130. The sealing member 150 is formed of at least one of transparent epoxy and silicon. Further, the sealing member 150 contains a reflective material such as $TiO_2$ or the like so as to prevent light, emitted from the LED chip 120 mounted on the phosphor substrate 110, from being absorbed or scattered into the sealing member 150.

Further, the sealing member 150 serves to radiate some of heat generated from the LED chip 120 to the outside.

Method of Manufacturing LED Package

Referring to FIGS. 3A to 3E, a method of manufacturing an LED package according to an embodiment of the invention will be described in detail.

FIGS. 3A to 3E are cross-sectional views sequentially showing a method of manufacturing an LED package according to an embodiment of the invention.

First, as shown in FIG. 3A, a phosphor substrate 110 is mounted on a substrate fixing device 200.

In this case, the phosphor substrate 110 according to the invention is formed of a glass substrate, which is formed by a hot press using a mixture of glass powder and phosphor powder, or a glass substrate having one surface coated with phosphor through spray coating.

In the case of the phosphor substrate 110 formed of a glass substrate having one surface coated with phosphor through the spray coating, the phosphor coating process can be performed separately from a main process for mounting an LED chip, which will be described below. Therefore, regardless of the main process, the phosphor coating process can be performed so that the thickness precision of the phosphor increases.

That is, an amount of phosphor can be maintained constantly through the phosphor substrate 110. Accordingly, a deviation of the color coordinate can be minimized, and a separate operation for adjusting the color coordinate is not necessary. Therefore, it is possible to enhance a manufacturing yield of LED packages.

Then, as shown in FIG. 3B, one or more circuit boards 130 are mounted on one surface of the phosphor substrate 110.

The circuit boards 130 are fixed to the phosphor substrate 100 through an adhesive and may be formed of ceramic having a pair of electrodes 130a.

Subsequently, as shown in FIG. 3C, one or more LED chips 120 are mounted on the other regions of the phosphor substrate 110 excluding the regions where the circuit boards 130 are mounted.

Then, the LED chips 120 and the electrodes 130a of the circuit boards 130 are electrically connected to each other through electrode connection portions 140 formed of wire.

Next, as shown in FIG. 3D, a dam 300 for defining a sealing member filling space is formed on a portion of the upper surface of the circuit board 130 adjacent to either side wall of the substrate fixing device 200.

Then, with the dam 300 being set to a barrier, the sealing member 150 is filled into the space defined on the phosphor substrate 110 having the LED chips 120 mounted thereon such that the LED chips 120, the phosphor substrate 110, and the circuit boards 130 are all covered by the sealing member 150.

The sealing member 150 may be formed of at least one of transparent epoxy and silicon. Preferably, the sealing member 150 contains a reflective material such as $TiO_2$ or the like so as to prevent light, emitted from the LED chips 120 mounted on the phosphor substrate 110, from being absorbed or scattered into the sealing member 150.

Further, the sealing member 150 serves to radiate some of heat generated from the LED chip 120 to the outside.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A light emitting diode (LED) package comprising:
a phosphor substrate having a phosphor;
an LED chip mounted on a surface of the phosphor substrate;
a circuit board mounted on only an other region of the surface of the phosphor substrate excluding a region—in which the LED chip is mounted, the circuit board having a pair of electrodes formed thereon, the pair of electrodes being disposed on the surface of the phosphor substrate at both ends thereof;
an electrode connection portion for electrically connecting the LED chip and the electrodes of the circuit board; and
a sealing member formed on the surface of the phosphor substrate, the sealing member covering the LED chip, the circuit board with the pair of electrodes, and the electrode connection portion, and having side surfaces, each of the pair of electrodes being exposed therethrough,
wherein the sealing member contains a reflective material dispersed therein and light emitted from the LED chip is reflected from the sealing member and passes through the phosphor substrate, and
wherein the side surfaces of the sealing member are respectively coplanar with each of the exposed surfaces of the electrodes and both ends of the phosphor substrate.

2. The LED package according to claim 1, wherein the phosphor substrate is a glass substrate having phosphor contained therein.

3. The LED package according to claim 1, wherein the phosphor substrate is a glass substrate coated with phosphor.

4. The LED package according to claim 1, wherein the electrode connection portion is formed of wire.

5. The LED package according to claim 1, wherein the sealing member is formed of at least one of transparent epoxy and silicon.

6. The LED package according to claim 1, wherein the circuit board is a ceramic substrate having one or more pairs of electrodes formed therein.

7. The LED package according to claim 1, wherein the pair of electrodes has direct contact with the surface of the phosphor substrate.

* * * * *